United States Patent
Hirano

(10) Patent No.: US 7,936,446 B2
(45) Date of Patent: May 3, 2011

(54) EXPOSURE APPARATUS AND DEVICE MANUFACTURING METHOD

(75) Inventor: Shinichi Hirano, Utsunomiya (JP)

(73) Assignee: Canon Kabushiki Kaisha (JP)

(*) Notice: Subject to any disclaimer, the term of this patent is extended or adjusted under 35 U.S.C. 154(b) by 613 days.

(21) Appl. No.: 11/935,814

(22) Filed: Nov. 6, 2007

(65) Prior Publication Data

US 2008/0106721 A1 May 8, 2008

(30) Foreign Application Priority Data

Nov. 7, 2006 (JP) ................................. 2006-302137

(51) Int. Cl.
- G03B 27/32 (2006.01)
- G03B 27/42 (2006.01)
- G03B 27/54 (2006.01)
- G03B 27/72 (2006.01)
- G03B 27/74 (2006.01)

(52) U.S. Cl. ................ 355/67; 355/53; 355/68; 355/71; 355/77

(58) Field of Classification Search .................. 250/205, 250/206, 492.2, 492.22, 548; 355/53, 67, 355/68, 71, 77; 359/196.1, 197.1, 198.1, 359/234, 202.1, 235

See application file for complete search history.

(56) References Cited

U.S. PATENT DOCUMENTS

| 2008/0143990 A1* | 6/2008 | Hirano | 355/68 |
| 2010/0026975 A1* | 2/2010 | Kikuchi | 355/53 |

FOREIGN PATENT DOCUMENTS

| JP | 61-034252 | | 8/1986 |
| JP | 05055106 A | * | 3/1993 |

* cited by examiner

Primary Examiner — Hung Henry Nguyen
Assistant Examiner — Colin Kreutzer
(74) Attorney, Agent, or Firm — Rossi, Kimms & McDowell LLP

(57) ABSTRACT

An exposure apparatus which illuminates a reticle with illumination light from a light source and projects light from the reticle onto a substrate to expose the substrate to light is disclosed. The apparatus comprises a shutter located on a path of the illumination light, a detector configured to detect a dose to the substrate, and a controller configured to control operation of the shutter. In a first exposure mode which uses illumination light with a first light intensity, the controller controls an open time of the shutter based on an output from the detector, and to store the open time. In a second exposure mode which uses illumination light with a second light intensity higher than the first light intensity, the controller controls a speed of the shutter based on the stored open time.

9 Claims, 11 Drawing Sheets

F I G. 3
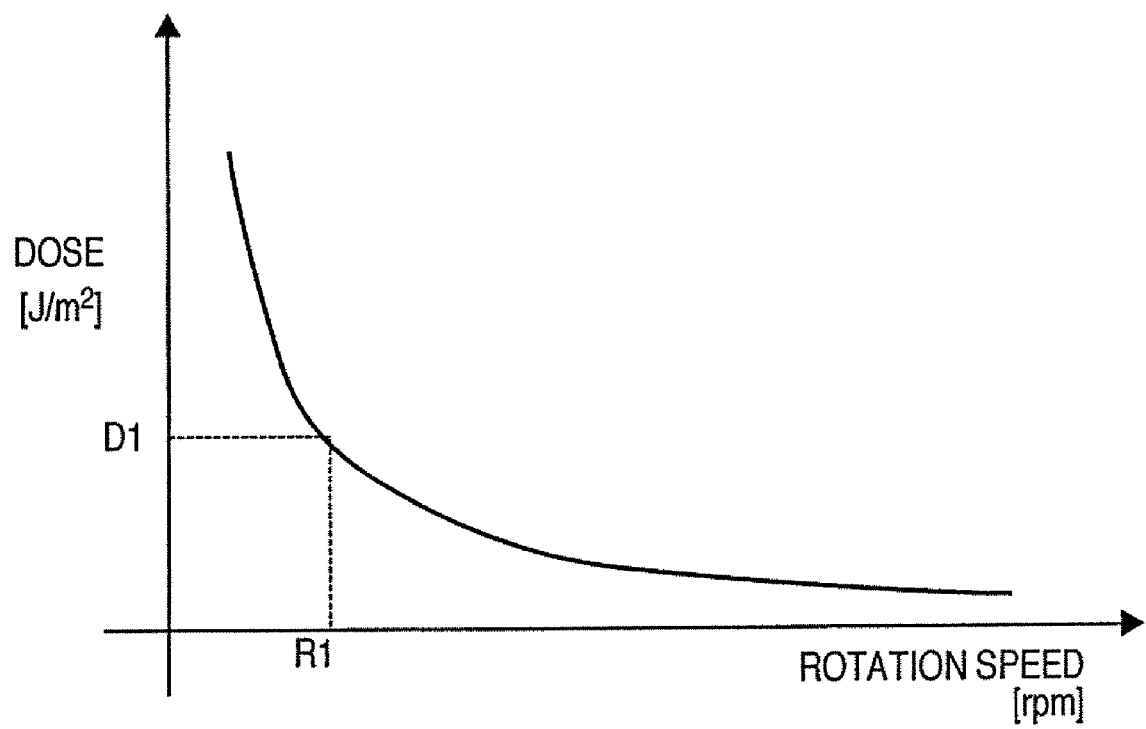

FIG. 4

EXPOSURE APPARATUS AND DEVICE MANUFACTURING METHOD

BACKGROUND OF THE INVENTION

1. Field of the Invention

The present invention relates to an exposure apparatus which illuminates a reticle with illumination light from a light source and projects light from the reticle onto a substrate to expose the substrate to light, and a method of manufacturing a device using the exposure apparatus.

2. Description of the Related Art

Japanese Patent Publication No. 61-34252 describes an exposure apparatus with an arrangement of detecting the intensity of light coming from a substrate or going to the substrate by a photoelectric detector, obtaining the output pulses of a frequency corresponding to the detection value, counting the pulses, and closing a shutter when the number of counted pulses reaches a predetermined pulse count. In the shutter, one rotary disk is provided with a light-shielding portion and light-transmitting portion alternately. By rotating the shutter, the light-shielding state and light-transmitting state of illumination light are controlled. An error caused by an operation delay time of the shutter, that is, by dose (exposure amount) of the substrate during a period since a shutter closing signal is generated until the shutter closes completely, must be corrected. For this purpose, the pulses corresponding to the dose due to the shutter operation delay when opening the shutter are counted. The timing to generate the shutter closing signal is corrected considering the pulse count.

When performing exposure control with a small dose, with the arrangement described in Japanese Patent Publication No. 61-34252, the timing to close the shutter may sometimes not be in time. To prevent this, a method of closing the shutter without counting the pulses, or a method of counting the pulses as described above while the light intensity is low and closing the shutter when the number of counted pulses reaches a predetermined pulse count can be adopted. As the method of decreasing the light intensity, a method of moving the position of the light source along the optical axis, and a method of inserting a neutral density filter between the light source and substrate may be possible.

The method of closing the shutter without counting the pulses, however, requires a technique to guarantee that the wafer or the shot region is exposed with an appropriate dose. With the method of performing exposure control as described above upon reducing the light intensity, the throughput decreases.

SUMMARY OF THE INVENTION

The present invention has been made with the recognition of the above background, and has as its exemplary object to realize a high throughput and accurate dose control.

According to the present invention, there is provided an exposure apparatus which illuminates a reticle with illumination light from a light source and projects light from the reticle onto a substrate to expose the substrate to light. The apparatus comprises a shutter located on a path of the illumination light, a detector configured to detect a dose to the substrate, and a controller configured to control operation of the shutter. In a first exposure mode which uses illumination light with a first light intensity, the controller controls an open time of the shutter based on an output from the detector, and to store the open time. In a second exposure mode which uses illumination light with a second light intensity higher than the first light intensity, the controller controls a speed of the shutter based on the stored open time.

The present invention can achieve, for example, a high throughput and accurate exposure amount control.

Further features of the present invention will become apparent from the following description of exemplary embodiments with reference to the attached drawings.

BRIEF DESCRIPTION OF THE DRAWINGS

FIG. 3 is a graph which illustrates the relationship between the target dose and the rotational speed of the shutter;

FIG. 4 is a view which illustrates a shot layout on a substrate;

DESCRIPTION OF THE EMBODIMENTS

A preferred embodiment of the present invention will be described below with reference to the accompanying drawings.

Figure 1:
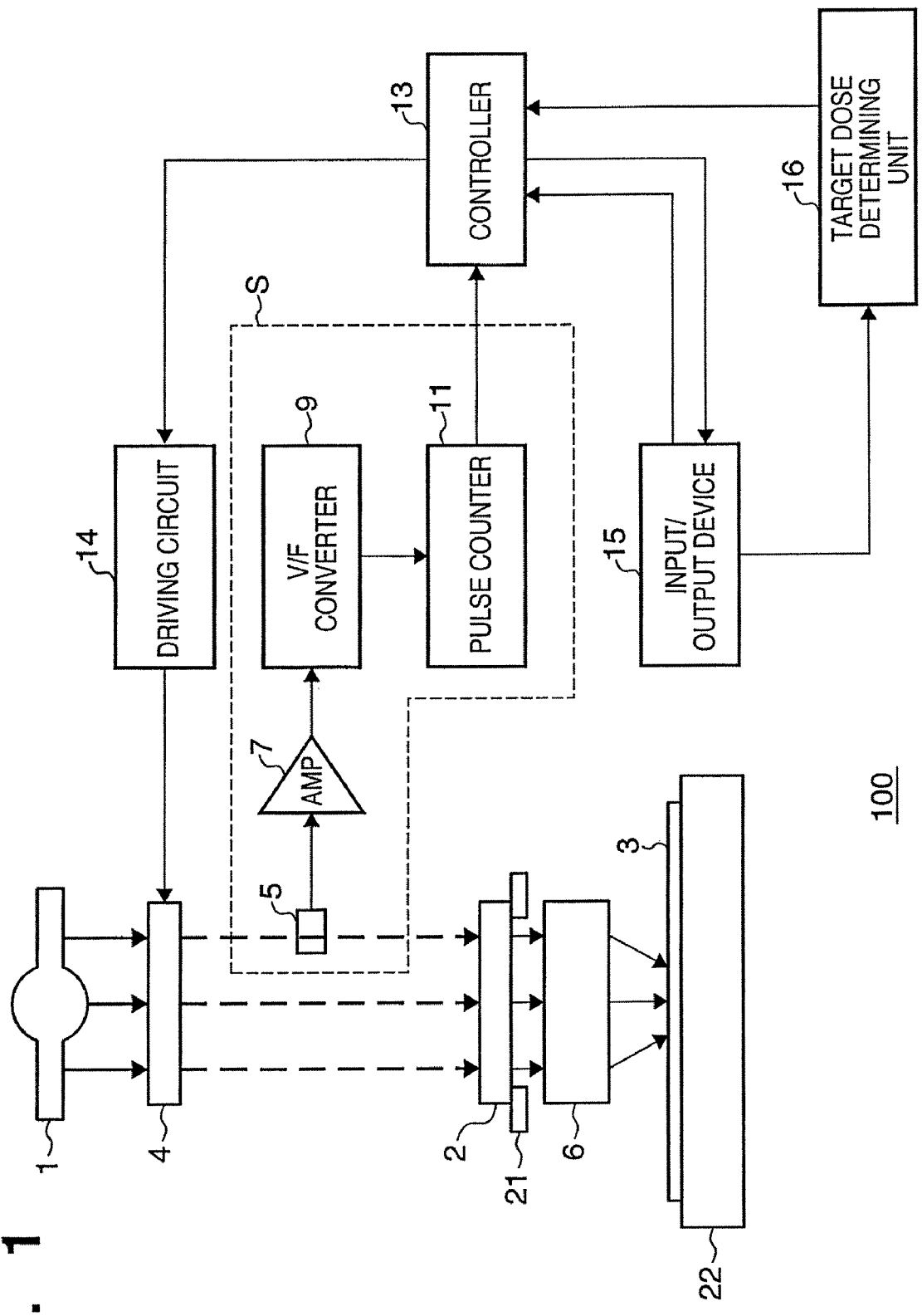
FIG. 1 is a view showing the schematic arrangement of an exposure apparatus according to a preferred embodiment of the present invention.

FIG. 1 is a view showing the schematic arrangement of an exposure apparatus according to a preferred embodiment of the present invention. An exposure apparatus 100 according to the preferred embodiment of the present invention comprises a light source 1, shutter 4, reticle stage 21, projection optical system 6, and substrate stage 22. The reticle stage 21 holds and positions an reticle 2. The reticle 2 has a pattern such as a semiconductor circuit pattern formed on it. Illumination light generated by the light source 1 illuminates the reticle 2. The substrate stage 22 holds and positions a substrate (wafer) 3 coated with a photoresist (photosensitive agent). The pattern of the reticle 2 is projected onto the substrate 3 through the projection optical system 6 to form a latent image pattern on the photoresist applied to the substrate 3. A developer develops the latent image pattern, thereby forming a resist pattern.

The shutter 4 is arranged between the light source 1 and reticle stage 21, and controls the incident time of the illumination light from the light source 1 to the reticle 2 to determine the exposure time of the substrate 3. The exposure apparatus 100 comprises a detector S which detects dose (exposure amount) of the substrate 3. The exposure amount sensor S can include, for example, an optical sensor 5, amplifier 7, V/F converter 9, and pulse counter 11. The optical sensor 5 detects the intensity of the illumination light between the shutter 4 and reticle stage 21. The optical sensor 5 includes a light-receiving element. The light-receiving element may be arranged in the optical path of the illumination light between the shutter 4 and reticle state 21, or to receive light extracted from the optical path by a mirror. The amplifier 7 converts a signal, output from the optical sensor 5 and indicating the light intensity, into a voltage signal. The V/F converter 9 converts the voltage signal output from the amplifier 7 into a frequency signal. The pulse counter 11 counts the pulses of the frequency signal output from the V/F converter 9. The pulse count counted by the pulse counter 11 indicates the cumulative amount of the light intensity of the illumination light and is accordingly proportional to the dose of the substrate. Hence, information indicating the dose of the substrate can be obtained from the pulse count.

The exposure apparatus 100 can further comprise a controller 13, input/output device 15, target exposure amount determining unit 16, shutter driving circuit 14, and the like. In a certain mode, the controller 13 controls the dose based on the output from the pulse counter 11. The shutter driving circuit 14 drives to open/close the shutter 4 upon reception of an instruction from the controller 13. The input/output device (console) 15 serves to input/output various types of pieces of information. The target exposure amount determining unit 16 determines the target dose based on the exposure conditions input through the input/output device 15, and other information which are input where necessary.

Figure 2A:
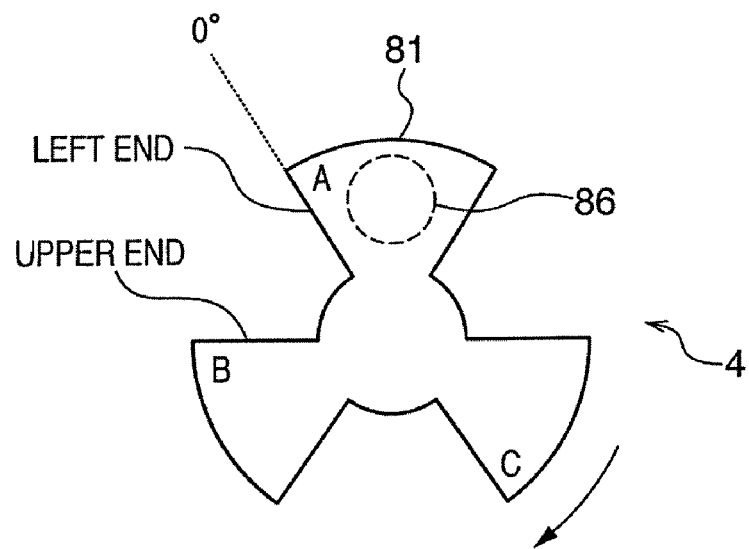
FIGS. 2A, 2B, and 2C are views to explain exposure control by shutter operation.
Figure 2B:
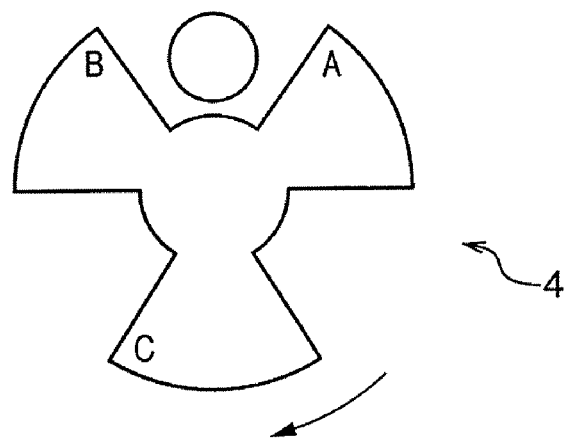
Figure 2C:
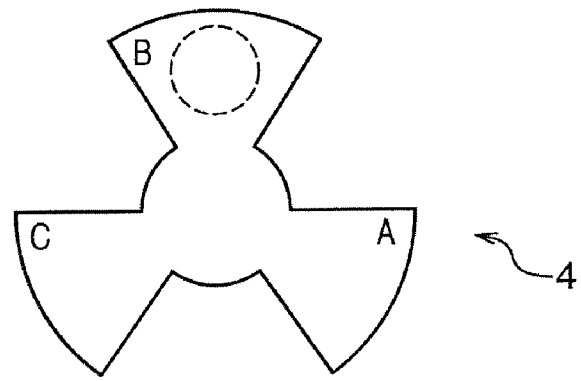

FIGS. 2A, 2B, and 2C are views to explain exposure control by operation of the shutter 4. The shutter 4 includes a shutter plate 81. FIGS. 2A, 2B, and 2C show the examples of the positional relationship between the shutter plate 81 and an optical path region 86 where the illumination light passes. FIG. 2A shows a state wherein a light-shielding portion A of the shutter plate 81 blocks the optical path region 86. FIG. 2B shows a state wherein the shutter plate 81 in the state of FIG. 2A rotates clockwise through 60° so it no longer blocks the optical path region 86. FIG. 2C shows a state wherein the shutter plate 81 in the state of FIG. 2B further rotates clockwise through 60° so a light-shielding portion B blocks the optical path region 86. The state wherein the optical path region 86 is not blocked is a state wherein the shutter 4 is open, and the state wherein the optical path region 86 is blocked is a state wherein the shutter 4 is closed.

According to this embodiment, the exposure sequence when exposing the substrate with a low dose exposure includes a low speed exposure mode (first exposure mode) which uses illumination light with the first light intensity, and a high speed exposure mode (second exposure mode) which uses illumination light with the second light intensity higher than the first light intensity. The high speed exposure mode is executed following the low speed exposure mode.

The low speed exposure mode can be performed for at least one leading substrate in a lot of a plurality of substrates. In the low speed exposure mode, while the intensity of light entering the substrate is decreased, the pulse counter 11 counts the pulses of the frequency signal output from the V/F converter 9. When the number of counted pulses reaches the target pulse count, the shutter 4 is closed. As a method of decreasing the light intensity to the first light intensity, a method of changing the position of the light source 1 along the optical axis, or a method of inserting a neutral density filter between the light source and reticle is possible.

The high speed exposure mode is targeted at substrates following the substrate exposed in the low speed exposure mode. For example, when the first substrate in the lot is exposed in the low speed exposure mode, the high speed exposure mode performs exposure for the second and following substrates of the lot. In the high speed exposure mode, the shutter 4 is rotated at a rotational speed determined based on the target dose and correction information which is obtained based on exposure control in the low speed exposure mode, without using the output from the exposure amount sensor S or decreasing the light intensity, to control the dose. In exposure of a one-shot region, in the state wherein the light-shielding portion A completely blocks the optical path region 86, as shown in FIG. 2A, the shutter 4 is rotatably driven through 120°, as shown in FIG. 2C. The exposure time is the time that lapses since the light-shielding portion A ends blocking the optical path region 86 until the light-shielding portion B starts blocking the optical path region 86. The rotational speed of the shutter 4 determines this time.

FIG. 3 is a graph which illustrates the relationship between the target dose and the rotational speed of the shutter 4 (rotational speed of the shutter plate 81). The relationship between the target dose and the rotational speed of the shutter 4 as illustrated in FIG. 3 can be obtained by an experiment or calculation, and can be stored in advance as, for example, an approximate function or data table, in the memory (not shown) of the controller 13. In the following description, the "memory" refers to the memory in the controller 13 unless particularly noted. In place of such a memory, a memory as an external device of the controller 13 can naturally be used.

Figure 4:
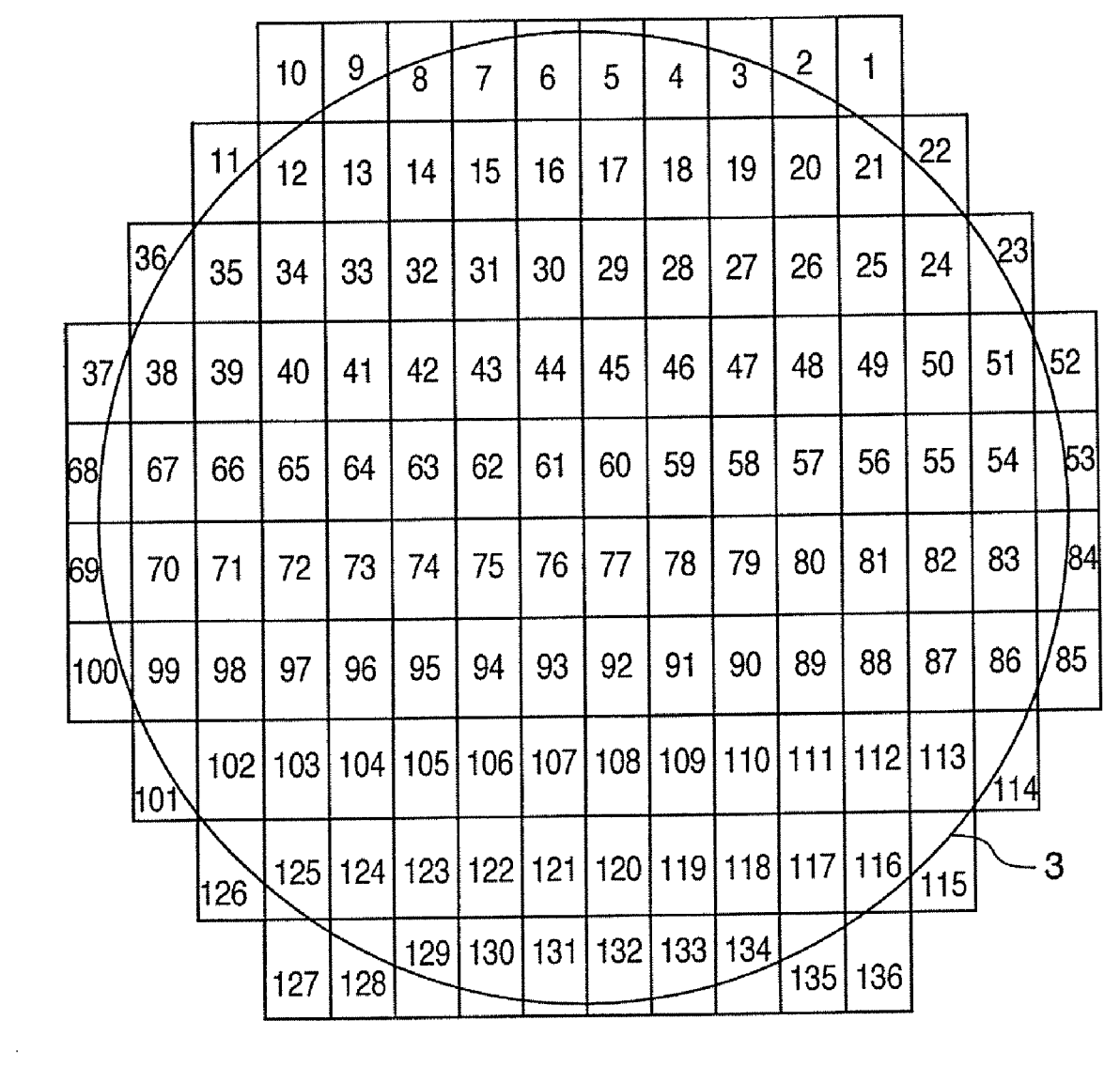

FIG. 4 is a view which illustrates a shot layout on the substrate. The regions arranged to form a grid on the substrate 3 show segmented exposure regions called shot regions. The figures described in the shot regions indicate exposure turns.

Figure 5:
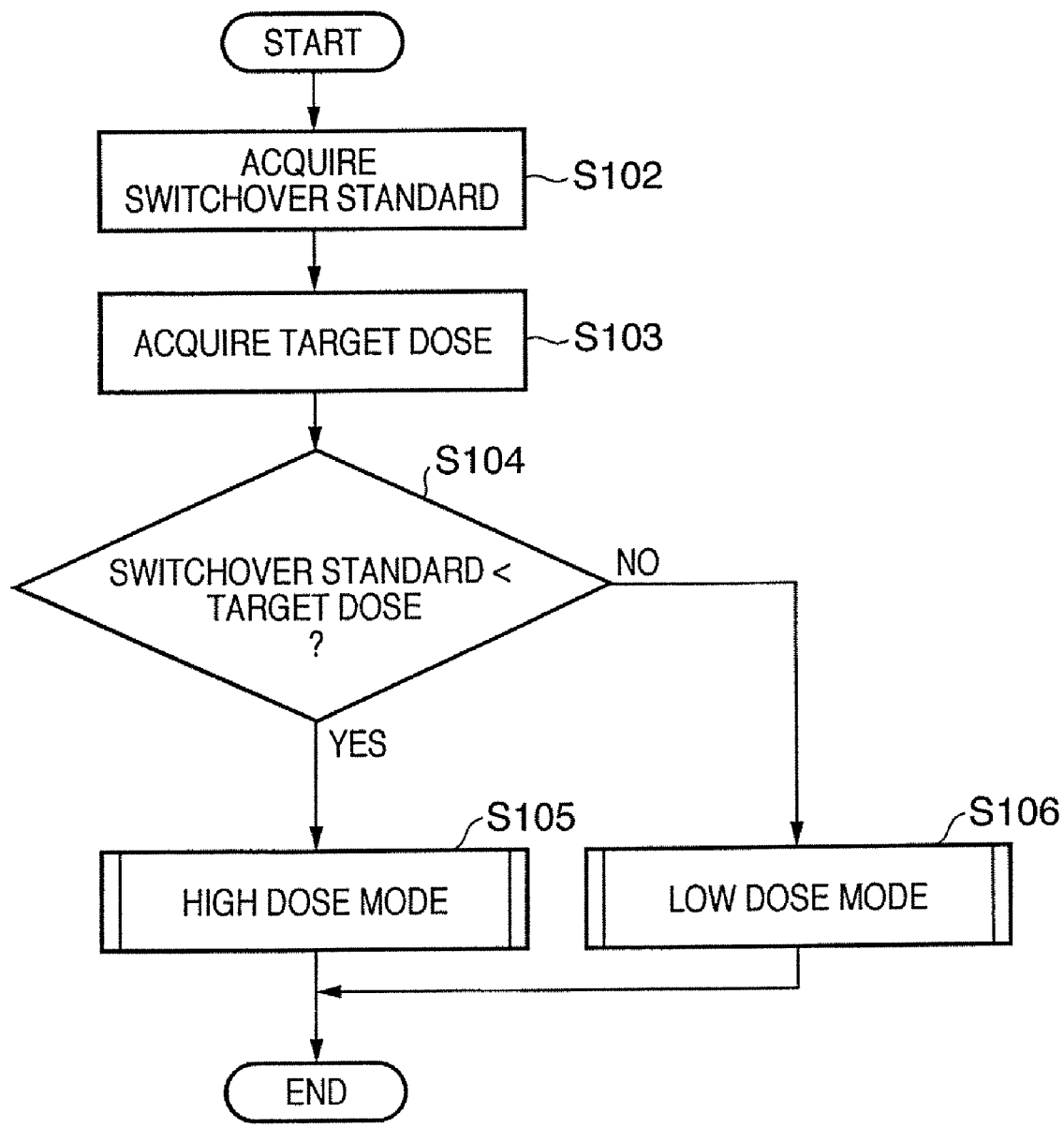
FIG. 5 is a flowchart showing a determination process in the exposure apparatus before executing an exposure sequence.

FIG. 5 is a flowchart showing a determination process in the exposure apparatus 100 before executing an exposure sequence.

In step S102, the controller 13 acquires a switchover standard input or preset through the input/output device 15. In step S103, the controller 13 acquires target exposure amount information (TargetDose) from the target exposure amount determining unit 16.

In step S104, the controller 13 compares the switchover standard acquired in step S102 with the target dose acquired in step S103. If the target dose is larger than the switchover standard, the process advances to step S105 to execute the exposure sequence in the high dose mode. If the target dose is equal to or smaller than the switchover standard, the controller 13 advances the process to step S106 to execute the exposure sequence in the low dose mode.

Figure 6:
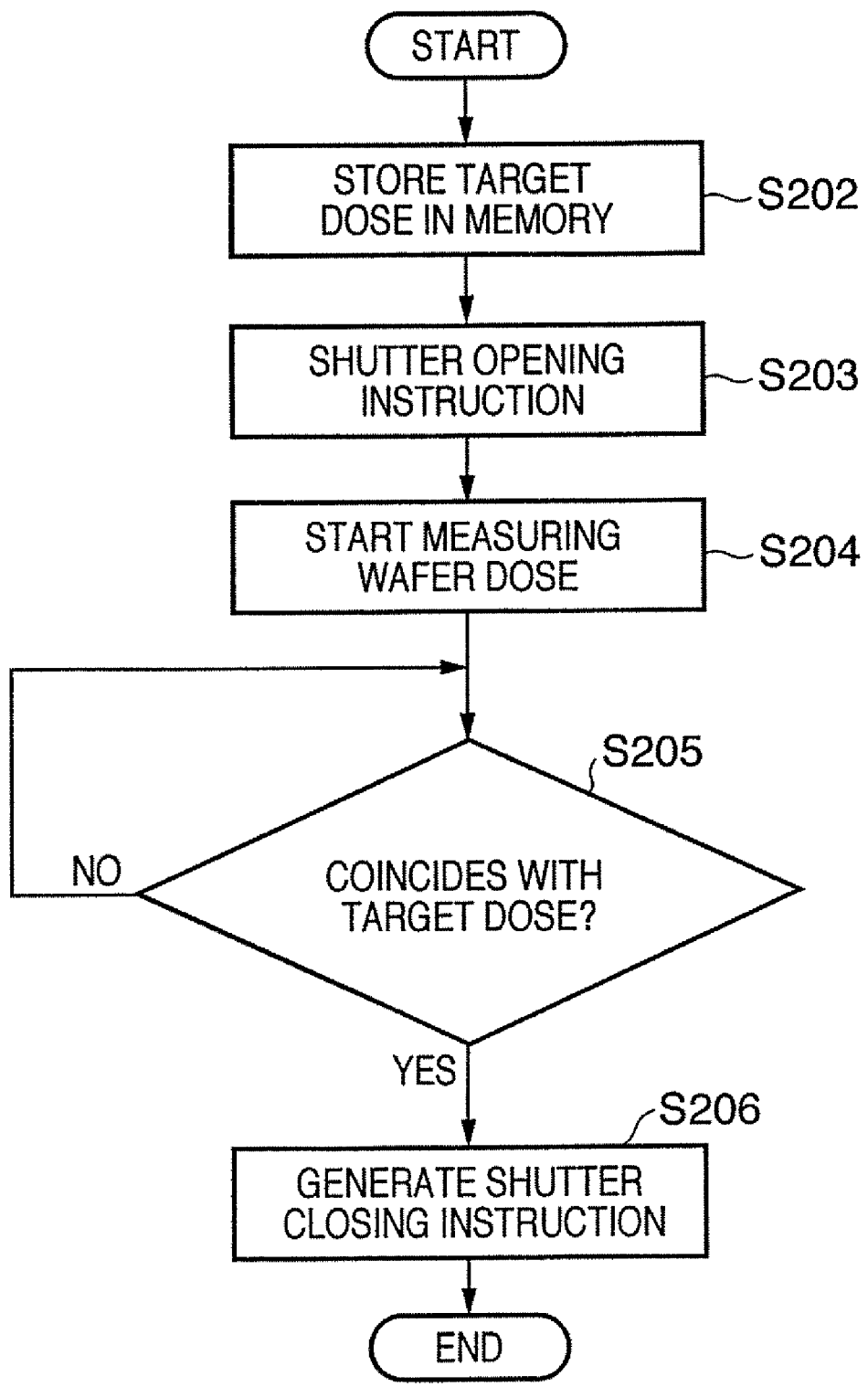
FIG. 6 is a flowchart showing an exposure sequence in a high dose mode.

FIG. 6 is a flowchart showing the exposure sequence in the high dose mode. In step S202, the controller 13 stores, that is, records, in the memory the target dose provided by the target exposure amount determining unit 16. In step S203, the controller 13 sends a shutter opening instruction to the shutter driving circuit 14 to open the shutter 4.

In step S204, the shutter 4 opens, and the illumination light generated by the light source 1 illuminates the reticle 2 to start exposure of the substrate 3. Simultaneously, measurement of the dose of the substrate (wafer) 3 is also started. More specifically, the amplifier 7 converts a signal, output from the optical sensor 5 and indicating the light intensity, into a voltage signal. The V/F converter 9 converts the voltage signal into a pulse train. The pulse counter 11 counts the pulses of the pulse train.

In step S205, the controller 13 reads the count provided by the pulse counter 11, and determines whether the count coincides with the pulse count determined by the target dose stored in the memory described above. Step S205 is repeated until the count provided by the pulse counter 11 coincides with the pulse count determined by the target dose exposure. When the two counts coincide, the controller 13 advances the process to step S206.

In step S206, the controller 13 sends a shutter closing instruction to the shutter driving circuit 14 to close the shutter 4.

Figure 7:
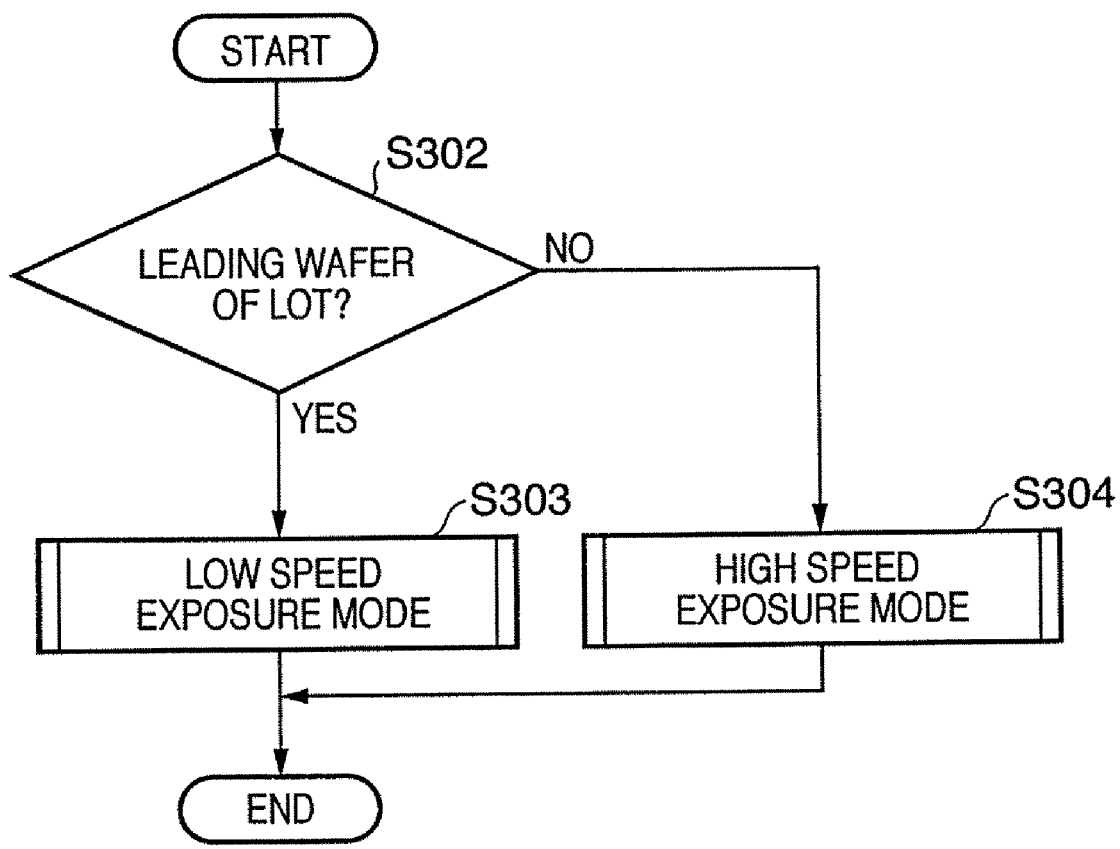
FIG. 7 is a flowchart showing an exposure sequence in a low dose mode.

FIG. 7 is a flowchart showing the exposure sequence in the low dose mode. In step S302, the controller 13 determines whether the substrate as the processing target is the target of exposure by the low speed exposure mode. The substrate as the target of exposure by the low speed exposure mode is typically at least one leading substrate of the lot. Which substrate should be the target substrate of exposure by the low speed exposure mode can be determined in accordance with, for example, information input through the input/output device 15. Alternatively, which substrate should be the target substrate of exposure by the low speed exposure mode can comply with the information preset as default information. As the target substrate of exposure by the low speed exposure mode, other than the substrates as described above, for example, at least one substrate can be selected that should be processed after the status in the exposure apparatus 100 changes (e.g., the operation time of the light source 1 exceeds a reference value).

When the substrate to process is a target substrate of low speed exposure, the controller 13 advances the process to step S303. If NO, the controller 13 advances the process to step S304.

Figure 8:
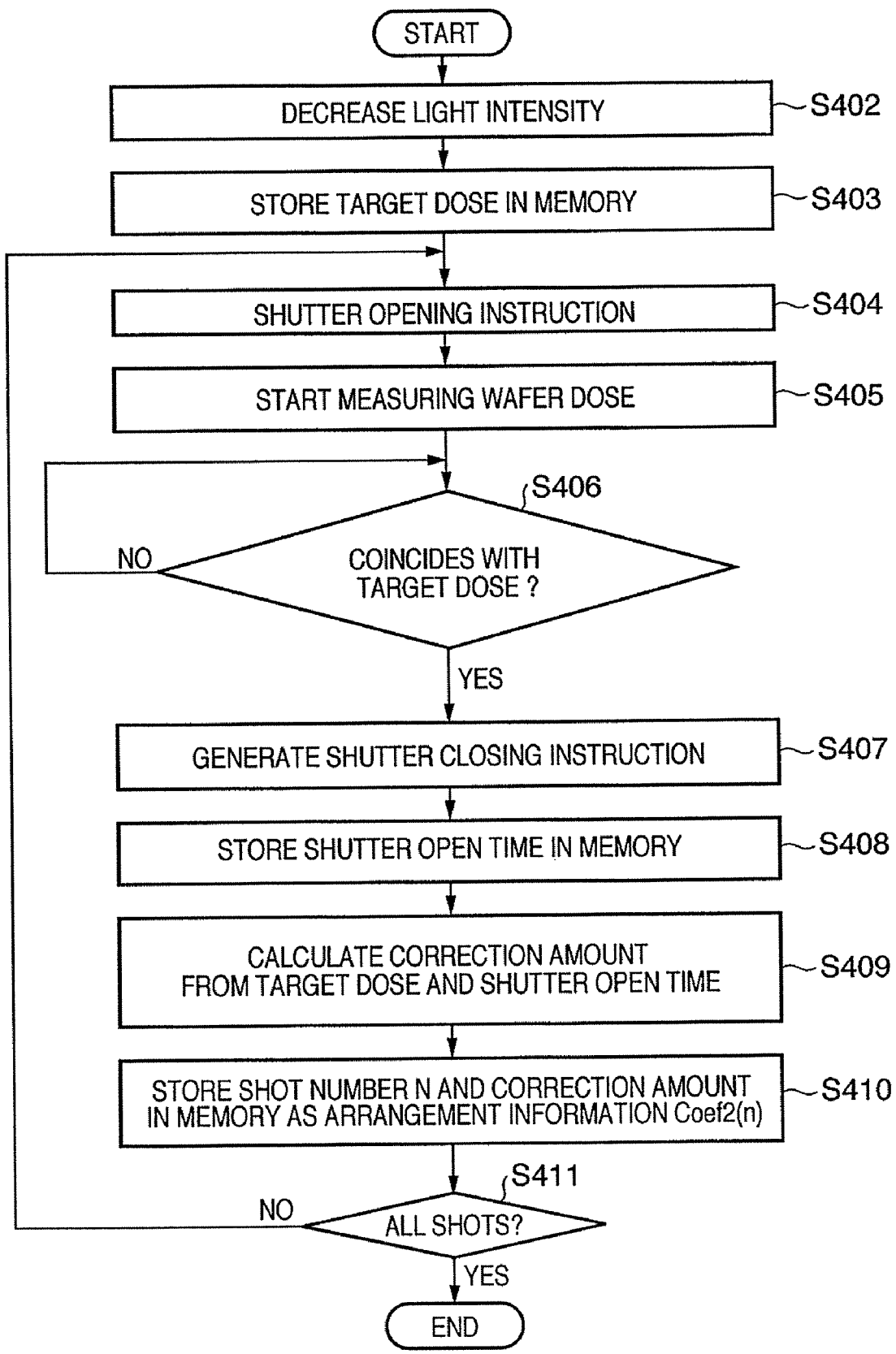
FIG. 8 is a flowchart showing an exposure sequence in a low speed exposure mode (first exposure mode)

FIG. 8 is a flowchart showing the exposure sequence in the low speed exposure mode (first exposure mode). Note that the shot number (N) is initialized to 1 at the start of the process shown in FIG. 8.

In step S402, the controller 13 decreases to the first light intensity the intensity of light entering the substrate. As a method of decreasing the light intensity, the method of changing the position of the light source 1 along the optical axis, or the method of inserting the neutral density filter between the light source and reticle may be possible, as described above. The intensity of light is decreased by closing the shutter 4 based on the output from the exposure amount sensor S, so that the target dose can be realized.

After the shutter 4 remains open for a sufficient period of time, the controller 13 sends a shutter closing instruction to the shutter driving circuit 14 based on the output from the exposure amount sensor S so as to close the shutter 4. With this method, the substrate can be exposed with an approximate dose.

In step S403, the controller 13 stores in the memory the target dose provided by the target exposure amount determining unit 16. In step S404, the controller 13 sends a shutter opening instruction to the shutter driving circuit 14 to open the shutter 4.

In step S405, the shutter 4 opens, and the illumination light generated by the light source 1 illuminates the reticle 2 to start exposure of the substrate 3. The amplifier 7 converts a signal, output from the optical sensor 5 and indicating the light intensity, into a voltage signal. The V/F converter 9 converts the voltage signal into a pulse train. The pulse counter 11 counts the pulses of the pulse train.

In step S406, the controller 13 reads the count provided by the pulse counter 11 of the exposure amount sensor S, and determines whether the count coincides with the pulse count determined by the target dose stored in the memory described above. Step S406 is repeated until the count provided by the pulse counter 11 coincides with the pulse count determined by the target dose. When the two counts coincide, the controller 13 advances the process to step S407.

In step S407, the controller 13 sends a shutter closing instruction to the shutter driving circuit 14 to close the shutter 4. More specifically, the controller 13 controls the timing to close the shutter 4 based on the count provided by the pulse counter 11 of the exposure amount sensor S.

In step S408, the controller 13 stores the time, taken since the shutter opening instruction (step S404) until the shutter closing instruction (step S407), in the memory as a shutter open time (ShutterOpenTime).

In step S409, the controller 13 calculates a correction coefficient (correction information) in accordance with equation (1) based on the target dose(TargetDose) stored in step S403 and the shutter open time (ShutterOpenTime) stored in step S408. In step S410, the controller 13 stores the calculated correction coefficient as the second correction coefficient (Coef2(N)), including a shot number (N) as an arrangement variable, in the memory.

$$\text{Coef2}(N) = \text{ShutterOpenTime} \times \text{TimeDoseConst} / \text{TargetDose} \quad (1)$$

where N is the shot number, TargetDose is the target dose [J/m$^2$], and ShutterOpenTime is the shutter open time [S]. Also, TimeDoseConst is a proportional constant [J/m$^2$·S], and Coef2(N) is the second correction coefficient.

In step S411, the controller 13 determines whether or not all the shot regions have undergone the exposure. If NO, the controller 13 increments the shot number (N) by one and returns the process to step S404.

When the exposure in the low speed exposure mode is targeted at a plurality of substrates, the second correction coefficient obtained for each of the plurality of substrates is calculated (by, e.g., mean calculation), and a second correction coefficient for the high speed exposure mode can be obtained based on this calculation result.

Figure 9:
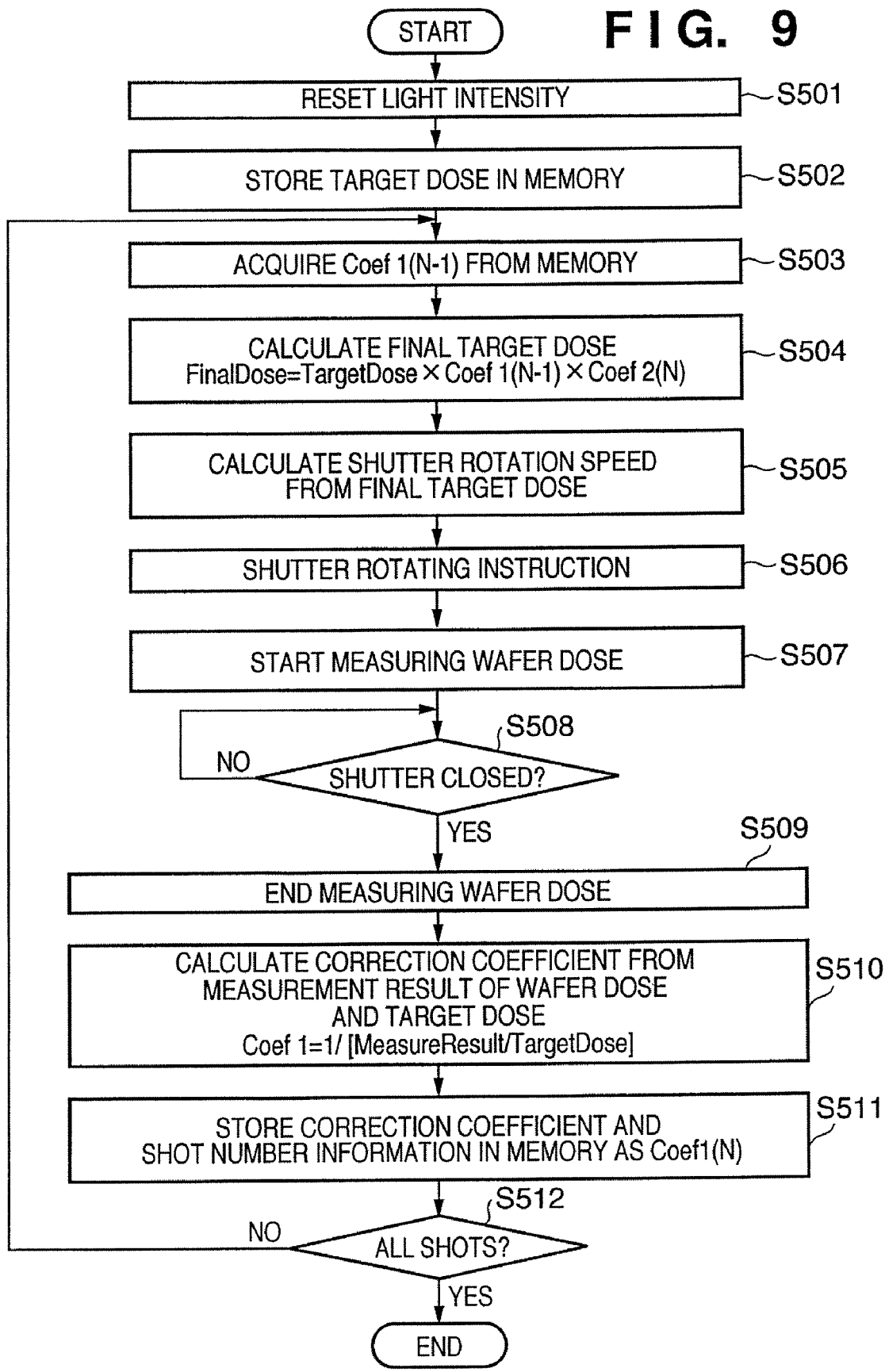
FIG. 9 is a flowchart showing an exposure sequence in a high speed exposure mode.

FIG. 9 is a flowchart showing the exposure sequence in the high speed exposure mode. Note that the shot number (N) of the exposure target is initialized to 1 at the start of the process shown in FIG. 9.

In step S501, the controller 13 checks whether the intensity of light entering the substrate has the second light intensity (typically the maximum light intensity). If NO, the controller 13 restores the light intensity to the second light intensity.

In step S502, the controller 13 stores in the memory the target dose provided by the target exposure amount determining unit 16. In step S503, the controller 13 acquires a first correction coefficient Coef1(N−1) stored in the memory for the purpose of Nth-shot exposure. A first correction coefficient Coef1(N−1) will be described later.

In step S504, the controller 13 calculates a final target dose (FinalDose) in accordance with equation (2) based on the first correction coefficient (Coef1(N−1)), second correction coefficient (Coef2(N)), and target dose (TargetDose). Note that Coef1(0) can be a default value.

$$\text{FinalDose} = \text{TargetDose} \times \text{Coef1}(N-1) \times \text{Coef2}(N) \quad (2)$$

where N is the shot number, TargetDose is the target dose [J/m$^2$], FinalDose is the final target dose [J/m$^2$], Coef1(N−1) is the first correction coefficient, and Coef2(N) is the second correction coefficient.

In step S505, the controller 13 calculates the rotational speed of the shutter 4 based on the final target dose (FinalDose). The rotational speed of the shutter 4 can be obtained by referring to the approximate function or data table which is stored in the memory and indicating the relationship between the target dose and the rotational speed of the shutter 4, as described with reference to FIG. 3. In the example shown in FIG. 3, assuming that the final target dose is D1, the corresponding rotational speed of the shutter 4 is R1.

In step S506, the controller 13 sends a shutter rotating instruction to the shutter driving circuit 14 to rotate the shutter 4 at the rotational speed obtained in step S505, thereby rotating the shutter 4.

In step S507, the shutter 4 opens, and the illumination light generated by the light source 1 illuminates the reticle 2 to start exposure of the substrate 3. The amplifier 7 converts a signal, output from the optical sensor 5 and indicating the light intensity, into a voltage signal. The V/F converter 9 converts the voltage signal into a pulse train. The pulse counter 11 counts the pulses of the pulse train.

In step S508, the controller 13 waits for the timing when the shutter 4 is completely closed based on the shutter rotational speed. After that, in step S509, the controller 13 ends the counting operation of the pulse counter 11. Note that in the high speed exposure mode (second exposure mode), the operation of the shutter 4 to control the dose for the Nth-shot region does not depend on the output (or counting operation) of the exposure amount sensor S during exposure of the Nth-shot region.

In step S510, the controller 13 calculates the actual dose (MeasureResult) from the number of pulses counted between step S507 and step S509. In step S510, the controller 13 also calculates the first correction coefficient (Coef1) from the actual dose (MeasureResult) and final target dose (TargetDose) in accordance with equation (3). The first correction coefficient (Coef1(N)) obtained in step S510 is used for calculation of the final dose (FinalDose) of the next shot, that is, the (N+1)th shot.

$$\text{Coef1}(N)=1/\{\text{MeasureResult}/\text{TargetDose}\} \quad (3)$$

where N is the shot number, MeasureResult is the actual dose [J/m$^2$], and TargetDose is the target dose [J/m$^2$].

In step S511, the controller 13 stores the value calculated in step S510 as Coef1(N) in the memory in relation to the shot number (N).

In step S512, the controller 13 determines whether or not all the shot regions have undergone the exposure. If NO, the controller 13 increments the shot number (N) by 1 and returns the process to step S503.

In the above explanation, the final target dose for the Nth-shot region of the exposure target is calculated based on the first correction coefficient which can be obtained by exposure of the (N−1)th-shot region that has already undergone exposure.

Alternatively, the final target dose for the Nth-shot region may be calculated based on the first correction coefficient for a shot region near, for example, the Nth-shot region.

Equations (1), (2), and (3) are examples of the calculation method. Other equations may be used in place of these equations. Also, an offset coefficient determined for each exposure apparatus or an offset coefficient determined in accordance with the exposure process conditions may be considered.

The method of using the correction coefficient of an immediately preceding shot is advantageous in correction of the driving error component of the shutter. The method of using the correction coefficient of a nearby shot is advantageous in correction of the error component generated depending on the wafer state or the process.

According to the preferred embodiment of the present invention, for example, in the low speed exposure mode (first exposure mode), the timing to close the shutter is controlled based on the output from the exposure amount sensor, and correction information obtained based on the shutter opening time is stored. In the high speed exposure mode (second exposure mode), the operation of the shutter is controlled based on the correction information. As a result, a high throughput can be obtained by the high speed exposure mode, and accurate exposure amount control is also achieved in the high speed exposure mode based on the correction information obtained in the low speed exposure mode.

Calculation of the correction information for each shot region can suppress variations in dose among the shot regions. The dose tends to be inaccurate for a shot region on the peripheral portion of the substrate, particularly, an irregular-shape shot region (a non-rectangular shot region). This embodiment also enables accurate exposure for such a shot region.

Figure 10:
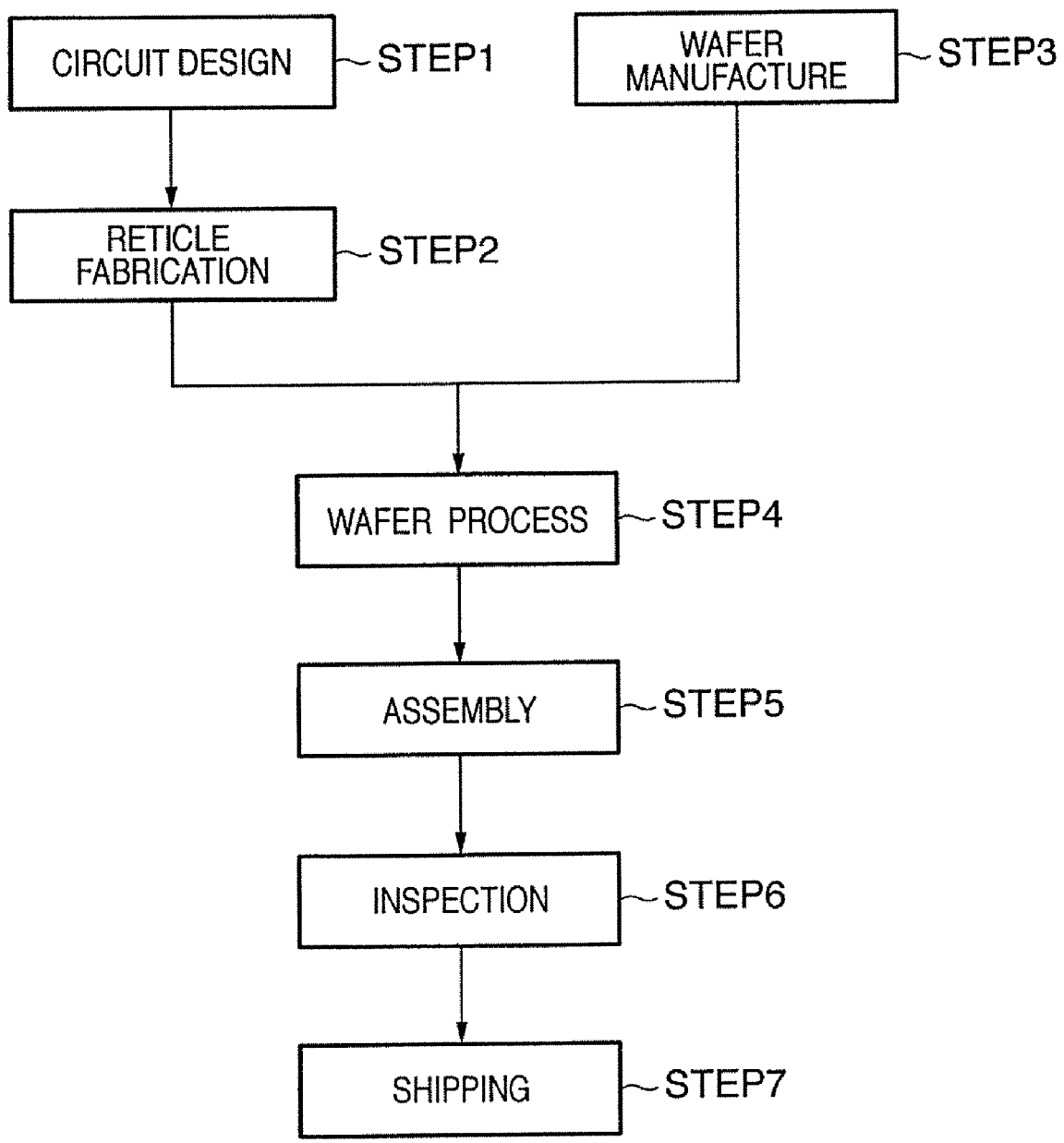
FIG. 10 is a flowchart showing the procedure of an overall semiconductor device manufacturing process.
Figure 11:
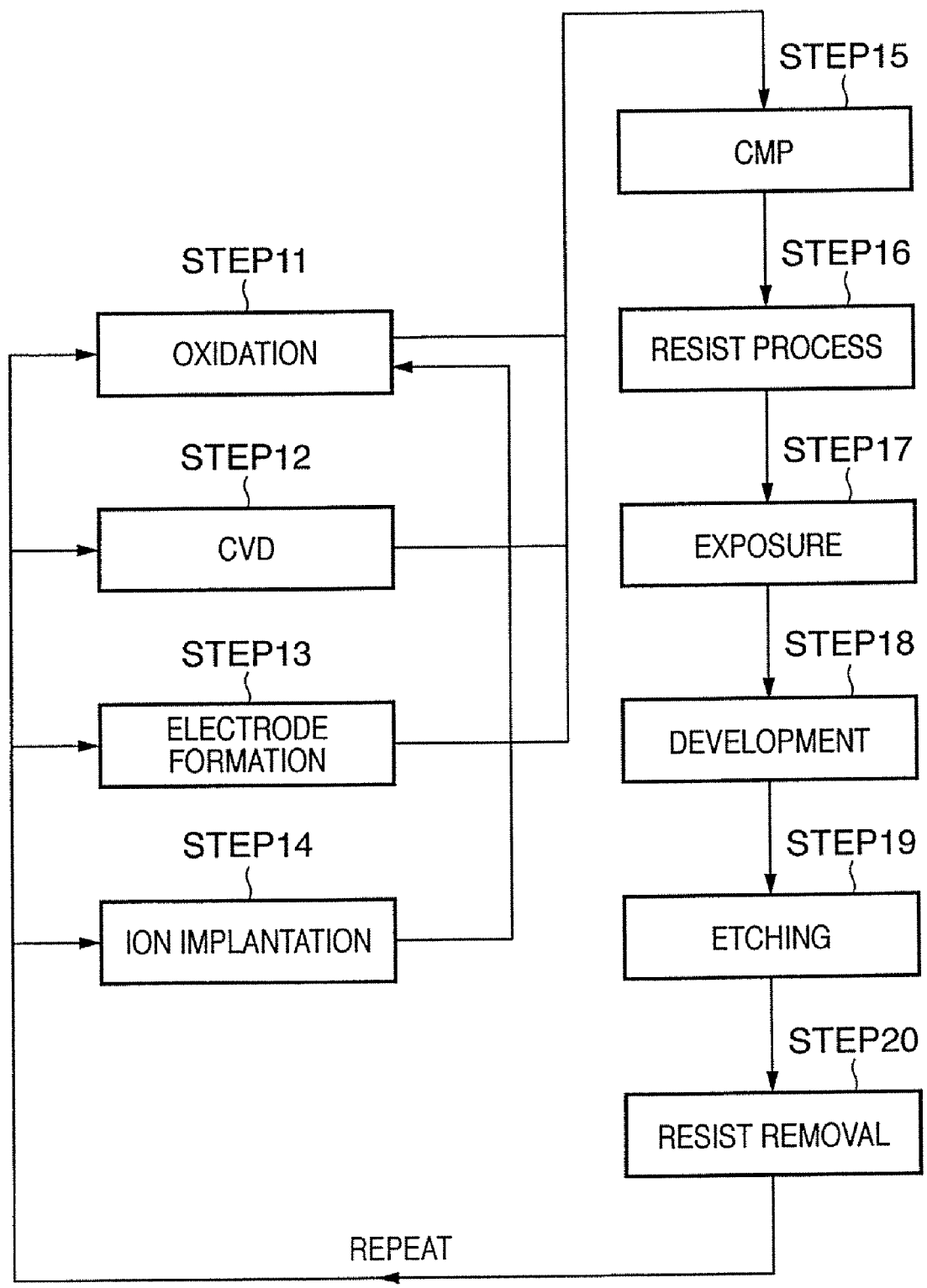
FIG. 11 is a flowchart showing the detailed procedure of a wafer process.

A device manufacturing method which utilizes the above exposure apparatus will be described. FIG. 10 is a flowchart showing the procedure of an overall semiconductor device manufacturing process. In step 1 (circuit design), the circuit of a semiconductor device is designed. In step 2 (reticle fabrication), a reticle (also called an original or mask) is fabricated based on the designed circuit pattern. In step 3 (wafer manufacture), a wafer (also called a substrate) is manufactured using a material such as silicon. In step 4 (wafer process) called a preprocess, an actual circuit is formed on the wafer by lithography using the reticle and wafer described above. The next step 5 (assembly) called a post-process is the step of forming a semiconductor chip by using the wafer fabricated in step 4. This step includes processes such as an assembly process (dicing and bonding) and a packaging process (chip encapsulation). In step 6 (inspection), inspections such as operation check test and durability test of the semiconductor device fabricated in step 5 are performed. A semiconductor device is finished with these steps and shipped (step 7). FIG. 11 is a flowchart showing the detailed procedure of the wafer process. In step 11 (oxidation), the surface of the wafer is oxidized. In step 12 (CVD), an insulating film is formed on the wafer surface. In step 13 (electrode formation), an electrode is formed on the wafer by deposition. In step 14 (ion implantation), ions are implanted into the wafer. In step 15 (CMP), the insulating film is planarized by CMP. In step 16 (resist process), a photosensitive agent is applied to the wafer. In step 17 (exposure), the exposure apparatus described above exposes the wafer coated with the photosensitive agent through the mask having the circuit pattern, to form a latent image pattern on the resist. In step 18 (development), the latent image pattern formed on the resist on the wafer is developed to form a resist pattern. In step 19 (etching), a layer or substrate under the resist pattern is etched through an opening of the resist pattern. In step 20 (resist removal), any unnecessary resist remaining after etching is removed. These steps are repeated to form multiple circuit patterns on the wafer.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-302137, filed Nov. 7, 2006, which is hereby incorporated by reference herein in its entirety.

What is claimed is:

1. An exposure apparatus which illuminates a reticle with illumination light from a light source and projects light from the reticle onto a substrate to expose the substrate to light, said apparatus comprising:
   a shutter located on a path of the illumination light;
   a detector configured to detect an exposure dose to the substrate; and
   a controller configured to control operation of said shutter, wherein in a first exposure mode which uses illumination light with a first light intensity, said controller is configured to control an open shutter time of said shutter based on an output from said detector, and to store the open shutter time, and in a second exposure mode which uses illumination light with a second light intensity higher than the first light intensity, said controller is configured to control a speed of said shutter based on the stored open shutter time, wherein said controller is configured to control the open shutter time in the first exposure mode for at least one leading substrate of a lot including a plurality of substrates, and to control the speed in the second exposure mode for every other substrate following the at least one leading substrate.

2. An apparatus according to claim 1, wherein in the first exposure mode, said controller is configured to store the open time for each of a plurality of shot regions, and in the second exposure mode, said controller is configured to control the speed for each of the plurality of shot regions based on the corresponding stored open time.

3. An apparatus according to claim 1, wherein in the second exposure mode, said controller is configured to control the speed further based on a dose to a shot region that has already undergone exposure, the dose being detected by said detector.

4. An apparatus according to claim 1, wherein in the second exposure mode, prior to starting exposure of a shot region, said controller is configured to determine the speed for the shot region.

5. An apparatus according to claim 1, wherein in the second exposure mode, said controller is configured to control a rotation speed of said shutter.

6. An apparatus according to claim 1, wherein said detector is configured to detect a dose to the substrate by accumulating an intensity of the illumination light.

7. A method of manufacturing a device, said method comprising:

exposing a substrate to light using an exposure apparatus;
developing the exposed substrate; and
processing the developed substrate to manufacture the device,
wherein the exposure apparatus is configured to illuminate a reticle with illumination light from a light source and is configured to project light from the reticle onto a substrate to expose the substrate to light, the exposure apparatus comprising:
a shutter located on a path of the illumination light;
a detector configured to detect an exposure dose to the substrate; and
a controller configured to control operation of said shutter,
wherein in a first exposure mode which uses illumination light with a first light intensity, said controller is configured to control an open shutter time of said shutter based on an output from said detector, and to store the open shutter time, and
in a second exposure mode which uses illumination light with a second light intensity higher than the first light intensity, said controller is configured to control a speed of said shutter based on the stored open shutter time, wherein said controller is configured to control the open shutter time in the first exposure mode for at least one leading substrate of a lot including a plurality of substrates, and to control the speed in the second exposure mode for every other substrate following the at least one leading substrate.

8. An exposure apparatus which illuminates a reticle with illumination light from a light source and projects light from the reticle onto a substrate to expose the substrate to light, said apparatus comprising:

a shutter located on a path of the illumination light;
a detector configured to detect an exposure dose to the substrate; and
a controller configured to control operation of said shutter;
wherein in a first exposure mode which uses illumination light with a first light intensity, said controller is configured to control an open shutter time of said shutter based on an output from said detector, and to store the open shutter time; and
in a second exposure mode which uses illumination light with a second light intensity higher than the first light intensity, said controller is configured to control a speed of said shutter based on the stored open shutter time;
wherein in the first exposure mode, said controller is configured to store the open time for each of a plurality of shot regions, and in the second exposure mode, said controller is configured to control the speed for each of the plurality of shot regions based on the corresponding stored open time.

9. An exposure apparatus which illuminates a reticle with illumination light from a light source and projects light from the reticle onto a substrate to expose the substrate to light, said apparatus comprising:

a shutter located on a path of the illumination light;
a detector configured to detect an exposure dose to the substrate; and
a controller configured to control operation of said shutter;
wherein in a first exposure mode which uses illumination light with a first light intensity, said controller is configured to control an open shutter time of said shutter based on an output from said detector, and to store the open shutter time, and
in a second exposure mode which uses illumination light with a second light intensity higher than the first light intensity, said controller is configured to control a speed of said shutter based on the stored open shutter time;
wherein said controller is configured to control the open shutter time in the first exposure mode for at least one leading substrate of a substrate set including a plurality of substrates, and to control the speed in the second exposure mode for every other substrate following the at least one leading substrate.

* * * * *